(12) United States Patent
Goutti

(10) Patent No.: US 6,307,438 B1
(45) Date of Patent: Oct. 23, 2001

(54) MULTISTAGE OPERATIONAL AMPLIFIER WITH STABILITY CONTROL

(75) Inventor: Frédéric Goutti, Grenoble (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/611,274

(22) Filed: Jul. 6, 2000

(30) Foreign Application Priority Data

Jul. 9, 1999 (FR) .................................................. 99 08930

(51) Int. Cl.$^7$ ........................................................ H03F 1/14
(52) U.S. Cl. ............................ 330/292; 330/257; 330/255
(58) Field of Search .................................. 330/255, 257, 330/292

(56) References Cited

U.S. PATENT DOCUMENTS

| 5,140,280 | * | 8/1992 | Vyne et al. ............................ 330/255 |
| 5,831,480 | * | 11/1998 | Kato et al. ............................ 330/253 |
| 5,900,780 | * | 5/1999 | Hirose et al. ......................... 330/253 |
| 5,990,748 | * | 11/1999 | Tomasini et al. ..................... 330/292 |
| 6,016,079 | * | 1/2000 | Reffay ................................... 330/255 |
| 6,084,476 | * | 7/2000 | Hamanishi et al. .................. 330/255 |
| 6,154,094 | * | 11/2000 | Seven ................................... 330/252 |
| 6,157,255 | * | 12/2000 | Felps ..................................... 330/252 |

FOREIGN PATENT DOCUMENTS 7-151797 * 6/1995 (JP) .

OTHER PUBLICATIONS

IBM TDB NN78091491 "General purpose Operational Amplifier" vol. 21, Issue 4 pp 1491–1492, Sep. 1978.*

* cited by examiner

Primary Examiner—Michael B. Shingleton
(74) Attorney, Agent, or Firm—Lisa K. Jorgenson; Allen, Dyer, Doppelt, Milbrath & Gilchrist, P.A.

(57) ABSTRACT

A multistage operational amplifier includes a transconductor input stage, an output stage, and an intermediate stage. A first Miller capacitor is connected between the input and the output of the intermediate stage. A second Miller capacitor is connected between the input of the intermediate stage and an output of the output stage. A current mirror is connected to the output from the intermediate stage to draw a current therefrom.

22 Claims, 2 Drawing Sheets

MULTISTAGE OPERATIONAL AMPLIFIER WITH STABILITY CONTROL

FIELD OF THE INVENTION

The present invention relates to electronics, and, more particularly, to a multistage operational amplifier capable of operating at a low power supply voltage.

For an operational amplifier, a low power supply voltage means a voltage on the order of 1.8 V. This voltage is equivalent to the voltage of two electrical batteries in series with a nominal voltage of 1.5 volts in a discharged state. The voltage across each of these electrical batteries when in the discharged state is about 0.9 volts.

An amplifier capable of operating at a voltage greater than or equal to 1.8 volts is thus capable of making the best use of the available energy in equipment powered by batteries. However, the use of the amplifier is not limited to battery powered equipment. The amplifier may be used in many types of electronic circuits, and particularly in circuits requiring a high current gain. Thus, the amplifier may be used in interface circuits and power stages, and also in summation circuits, and filters, etc. In particular, the amplifier may be used in battery powered portable electrical equipment, earphones and mobile telephones.

BACKGROUND OF THE INVENTION

A basic diagram for a known type of multistage operational amplifier is illustrated in FIG. 1. The amplifier includes an input transconductor stage marked as reference 10. The transconductor stage 10 includes a differential input with two input terminals 12+ and 12−, and a current output 14. The input terminals 12+ and 12− respectively correspond to a non-inverting input and an inverting input. Output 14 is connected to a system of gain stages including, in order, a first intermediate stage 20, a second intermediate stage 30 and an output stage 50. The stages are connected in parallel between power supply terminals 1 and 2.

The first and second intermediate stages and the output stage respectively include first, second and third bipolar transistors 22, 32 and 52 in a common-emitter configuration. The transistors 22, 32 and 52 are biased by respective current sources 24, 34 and 54. The base and collector of each transistor forms the respective input and output terminals of the corresponding stage.

The base of the first bipolar transistor 22 is connected to the current output 14 from the input stage 10, and its collector is connected to the base of the second transistor 32. Furthermore, the collector of the second transistor 32 is connected to the base of the third transistor 52 of the output stage. The collector of the third transistor 52 forms an amplifier output terminal 56. The output terminal is more precisely identified as reference 56. The output stage 50 is connected to an external load L shown as a discontinuous line. This load, which does not form part of the amplifier, is considered as having an impedance with a capacitive component equal to C1.

FIG. 1 also shows a number of capacitors. A second Miller capacitor 60 with value CM is connected between the input of the first stage 20, i.e., the base of the first transistor 22, and the amplifier output terminal 56. A first Miller capacitor 62 with value $CM_2$ is connected between the base and the collector of the first transistor 22, i.e., between the input and the output of the first intermediate stage 20. A third Miller capacitor 63 with value $CM_3$ is connected between the base and the collector of the third transistor 52, i.e., between the input and the output of the output stage 50.

Capacitors 60, 62 and 63 are frequency compensation capacitors that stabilize the amplifier in a closed loop. These capacitors are usually referred to as "Miller capacitors". Other capacitors of the same type may be provided. In general, frequency compensation capacitors are connected between the input of a given stage and the output of the stage, or the output of a next stage, in the sequence of gain stages.

The terms "next" and "previous" used herein refer to a defined direction in the sequence of stages starting from the input stage and working towards the output stage. This is the direction in which a signal passes through the amplifier. The Miller capacitors and external capacitors connected to the amplifier govern its own frequency behavior and the frequency behavior of each of its stages. This behavior is characterized by poles. The poles correspond to the frequencies at which modifications to the gain slope are observed in a frequency response diagram or a Bode diagram. The Bode diagram expresses the amplifier gain as a function of the frequency of a signal passing through the amplifier.

As shown in the example in FIG. 1, a first pole $p_1$ can be defined corresponding to the output stage 50 and generated by the capacitive part of the external load L connected to the amplifier output. The expression of the first pole $p_1$, for which the dimension is a pulse, is such that:

$$p_1 = \frac{gm_3}{C1}$$

In this expression, C1 is the capacitive value of the load L and $gm_3$ is the transconductance of the third transistor 52, i.e., the output stage.

The first pole corresponds to a frequency $f_1$ such that:

$$f_1 = \frac{P_1}{2\pi}$$

In the same way, a second pole corresponding to the second intermediate stage 30 can be defined. This pole is an intermediate pole and corresponds to a pulse $P_2$ for which the expression is more complex. The result is:

$$P_2 = \frac{CM}{CM_2} \times \frac{gm_2}{CM_3}$$

CM, $CM_2$, $CM_3$ are the respective values of the first, second and third capacitors, and $gm_2$ is the transconductance of the second transistor 32. The second pole has a frequency:

$$f_2 = \frac{P_2}{2\pi}.$$

Finally, a frequency called the unit gain frequency associated with the first capacitor 60, with value equal to CM, is provided to stabilize the amplifier in a closed loop. The expression of the unit gain frequency of the amplifier, denoted $f_{gu}$, is:

$$f_{gu} = \frac{gm}{2\pi CM}$$

In this expression gm denotes the transconductance of the input stage 10.

The values CM, $CM_2$ and $CM_3$ must be chosen to satisfy the following stability equation in order to stabilize the amplifier, in other words, to avoid a parasitic oscillation phenomena:

$$f_{gu} \leq k_2 f_2 \leq k_1 f_1$$

The variables $k_1$ and $k_2$ are multiplication factors such that $k_2 > 1$, $k_1 > 1$.

The equation shown above, called the first stability equation, represents the fact that the frequencies of the poles introduced in the successive stages from the input to the output of the amplifier must be increasing and distinct. This rule, applicable to the example in FIG. 1, remains true for an amplifier with a different number of gain stages. The values of the multiplication factors k and k', usually equal to 2, must be chosen to be greater than 1 to insure that the poles are not coincident. A large value for these factors results in the amplifier having good stability.

As described above, the choice of Miller capacitors is dictated by the stability equation. The capacitors are chosen particularly to satisfy the stability equation when the transistors in the gain stages carry an amplifier rest current. This rest current is the current that conducts through the transistors in the gain stages when there is no signal applied to the amplifier input.

For a given stage with one or more bipolar transistors, the value of the transconductance depends on the current in the collector of the transistor(s). More precisely, for each intermediate stage:

$$gm_i = \frac{I_i}{V_T}$$

In this expression, $gm_i$ and $I_i$ respectively denote the transconductance and the collector current of the transistor in the stage considered. The term $V_t$ is a thermal voltage defined by:

$$V_t = \frac{kT}{q}$$

where T is the temperature, k is the Boltzmann constant and q is the electron charge. Thus, for a second intermediate stage in which the collector current is denoted $IC_2$, we have:

$$gm_2 = \frac{I_2}{V_T}$$

When a signal is applied to the amplifier input, collector currents different from rest currents pass through the transistor collectors. Thus, the values of pole frequencies that depend on transconductances are modified and tend to increase. This phenomenon is referred to as frequency excursion of the poles. The frequency excursion of the poles depends essentially on the gains of the transistors used and external usage conditions of the amplifier that define collector currents in the stages.

The behavior of the amplifier is also characterized by one or several zeros that correspond to inflections in the amplifier phase curve. The phase curve is equal to the phase difference between the amplifier output and input, expressed as a function of the frequency. Each stage of the amplifier including a capacitance that may or may not be parasitic, may cause a zero in the phase curve. This subject is described in more detail in "Analysis and Design of Analog Integrated Circuits", by Paul R. Gray and Robert G. Meyer, Third Edition, page 621, §9.4/3, eq. 9/27a, FIGS. 9–23, John Wiley & Sons, Inc.

In the example in FIG. 1, the first Miller capacitor 62 in the first intermediate stage introduces a zero denoted $z_0$ for this stage, the expression of which is:

$$Z_0 = \frac{gm_1}{CM_2}$$

The variable $gm_1$ is the transconductance of the transistor in the first stage.

The zero corresponds to a frequency $f_0$ such that:

$$f_0 = \frac{1}{2\pi} Z_0$$

The stability of the amplifier imposes a sufficient separation of the frequency $f_0$ and frequencies corresponding to the amplifier poles. A second stability equation can be defined with reference to the first stability equation given above, expressed as $f_0 > f_1$ or, in other words, $z_0 > p_1$.

As mentioned above, the collector currents and the transconductances of the stages are known at rest, i.e., when no signal is applied to the amplifier. Therefore, the values of the Miller capacitors can be chosen such that the stability equations are satisfied. When the amplifier outputs high currents, the currents in the intermediate stages also vary. Since the conductances of the stages are proportional to the collector current in the corresponding bipolar transistors, the values of the poles and zeros change.

However, changes to poles and zeros are not uniform and stability equations may no longer be satisfied for high currents. For example, with reference to FIG. 1, the output current at terminal 56 increases when the collector current in transistor 52 in the output stage 50 increases. The increase in this current causes an increase in the transconductance $gm_3$ and, therefore, the frequency $f_1$, the expression of which was given previously.

The transistors in the output stage 50 and the second intermediate stage 30 are of a type with opposite conductivities, PNP and NPN respectively. The base current in transistor 52 in the output stage is thus added to the current, denoted $I_2$, that conducts through transistor 32 in the second intermediate stage 30. Therefore, an increase in the amplifier output current causes an increase in the current $I_2$ in transistor 52. As described above, this causes a frequency excursion of the pole $p_1$ of the output stage, for which the frequency $f_1$ increases.

The transistors in the first and second intermediate stages are both of the NPN type. The base current of transistor 32 of the second intermediate stage 30 is subtracted from the collector current of transistor 22 in the first intermediate stage. Thus, when the amplifier output current increases, the collector current in transistor 22 in the first intermediate stage reduces.

A reduction of this current also reduces the transconductance $gm_1$ and, therefore, the frequency $f_0$ of the zero. Thus, if $f_0$ decreases too much and $f_1$ increases too much, the second stability equation may no longer be valid. The example given above with reference to FIG. 1 shows the disturbances that can occur following a frequency excursion of the poles and the zeros of an amplifier.

At high frequency, additional zeros or poles may also occur due to the increasing influence of parasitic capacitances that are negligible at low frequency. These zeros or poles also produce instabilities and oscillations of the amplifier when their frequencies intersect or do not satisfy stability equations.

One approach to prevent these oscillations includes limiting the maximum amplifier output current such that the frequency excursion of the poles and zeros remains moderate compared with the values defined with a rest current. However, this approach is not satisfactory, particularly for amplifiers that may be powered at low voltage. The output current limitation would reduce the power that could be controlled by the amplifier.

SUMMARY OF THE INVENTION

In view of the foregoing background, it is therefore an object of the present invention to provide an improved multistage operational amplifier that is stable and has a high current gain, i.e., a high ratio between the maximum output current and the rest current.

Another object of the present invention is to avoid the appearance of zeros at some frequencies, for one or more stages, and therefore eliminate instabilities due to these zeros.

Yet another object of the present invention is to provide an amplifier capable of operating at a low power supply voltage.

These and other objects, features and advantages in accordance with the present invention are provided by an operational amplifier comprising a transconductor input stage with differential input terminals and an output terminal, an output stage, and at least one intermediate stage connected between the input stage and the output stage so as to form a sequence of stages. The output stage and each intermediate stage comprise at least one bipolar transistor in a common-emitter configuration connected between first and second power supply terminals. The bipolar transistor for each stage includes a base forming an input terminal for the stage, and a collector forming an output terminal for the stage.

The input terminal for each intermediate stage is connected to the output terminal of a previous stage in the sequence of stages. The output terminal of each intermediate stage is connected to an input terminal of the next stage in the sequence of stages. A first Miller capacitor is connected between the input terminal and the output terminal of at least one intermediate stage, and a second Miller capacitor is connected between the input terminal of the intermediate stage and an output terminal of a next stage in the sequence.

According to the invention, the amplifier also comprises a current mirror with a driver branch and a slave branch. The driver branch is connected to the output terminal of the next stage in the sequence through a capacitor called a copy capacitor. The slave branch is connected to the output terminal of the intermediate stage equipped with the first Miller capacitor. The current mirror is used to remove a current proportional to the current that is output by the second Miller capacitor at this stage, i.e., from the output of the intermediate stage equipped with the first Miller capacitor.

In this description, it is understood that the Miller capacitors or the copy capacitor which are connected to each amplifier may each be formed by one or several capacitors. In the same way, each transistor may be formed by one or several transistors connected in parallel.

The slave branch of the current mirror is designed to remove a current with an intensity that increases with the frequency. This is due to the fact that the current in the slave branch is proportional to the current in the driver branch, and the current in the driver branch is set by the copy capacitor. The impedance of the copy capacitor reduces with the frequency. This characteristic can be used to delay or cancel the appearance of a zero related to a phase inversion in the stage equipped with the current mirror.

According to one particularly advantageous characteristic of the invention, a copied current ratio from the driver and slave branches of the current mirror and a value of the copy capacitor may be chosen such that the current from the output from the intermediate stage is approximately equal to a current that may pass through the second Miller capacitor.

Due to this characteristic, it is possible to avoid the current in the first Miller capacitor from changing direction with the frequency. Thus, the zero of the stage equipped with the current mirror disappears and, consequently, there is no risk that it could be the cause of instability in the amplifier.

In order to sample a current approximately equal to the current passing through the second Miller capacitor at the output from the intermediate stage, the ratio of the Miller capacitor to the copy capacitor may be chosen approximately equal to the copied current ratio of the current mirror. In one particular embodiment, the copied current ratio may be approximately equal to 1, and the copy capacitor may be approximately equal to the Miller capacitor.

BRIEF DESCRIPTION OF THE DRAWINGS

Other characteristics and advantages of the invention will become clearer from the following description with reference to the figures in the attached drawings. This description is given for illustration purposes only and is in no way restrictive.

DETAILED DESCRIPTION OF THE PREFERRED EMBODIMENTS

Figure 1:
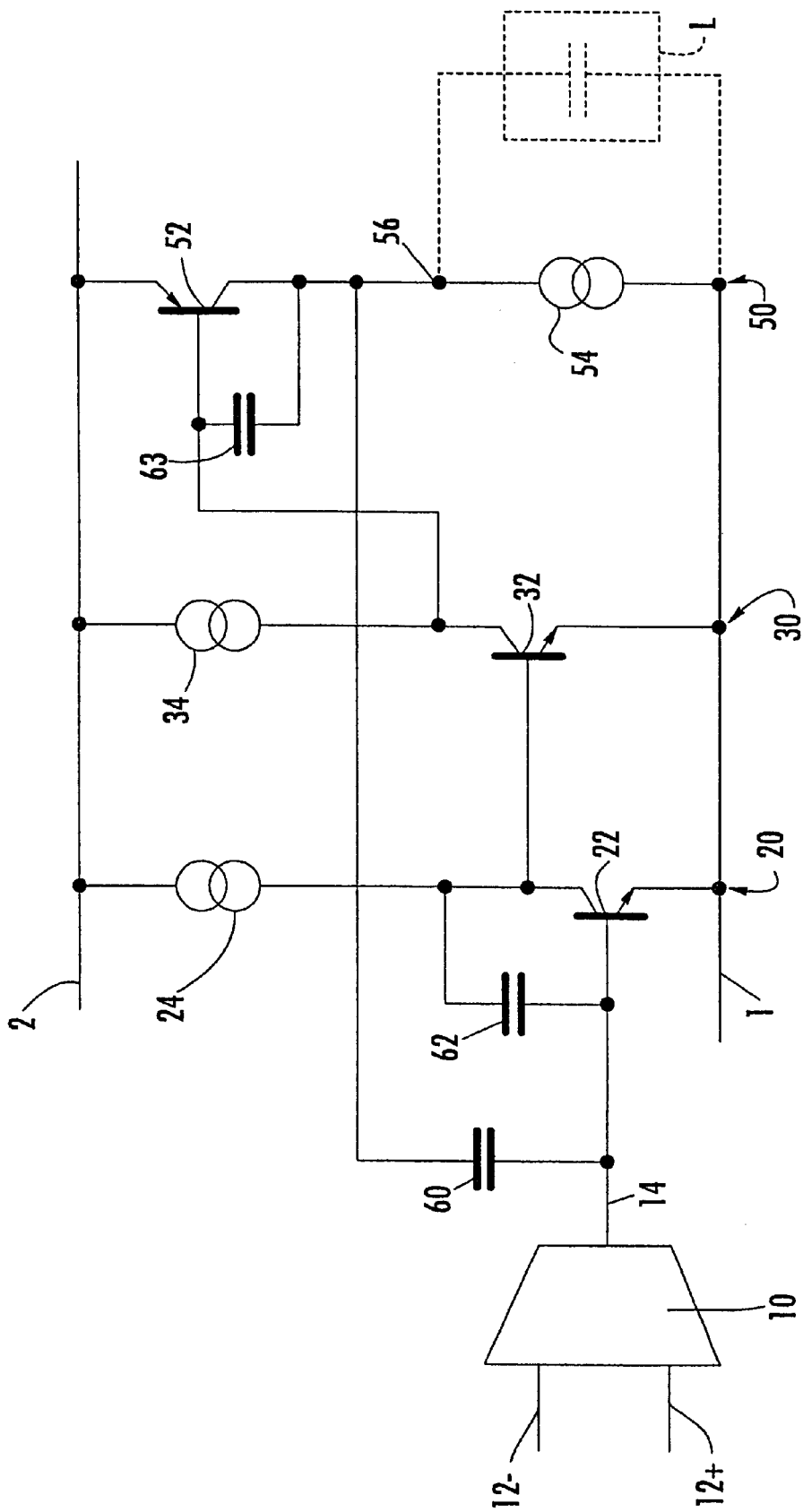
FIG. 1 is a circuit diagram of a multistage operational amplifier according to the prior art.

The example embodiment described below with reference to FIG. 2 applies to an operational amplifier, wherein the basic structure is similar to the amplifier in FIG. 1. Thus, the parts that are identical, similar or equivalent to parts in FIG. 1 are marked with the same numeric references plus 100. The description above can be referred to for these parts.

Figure 2:
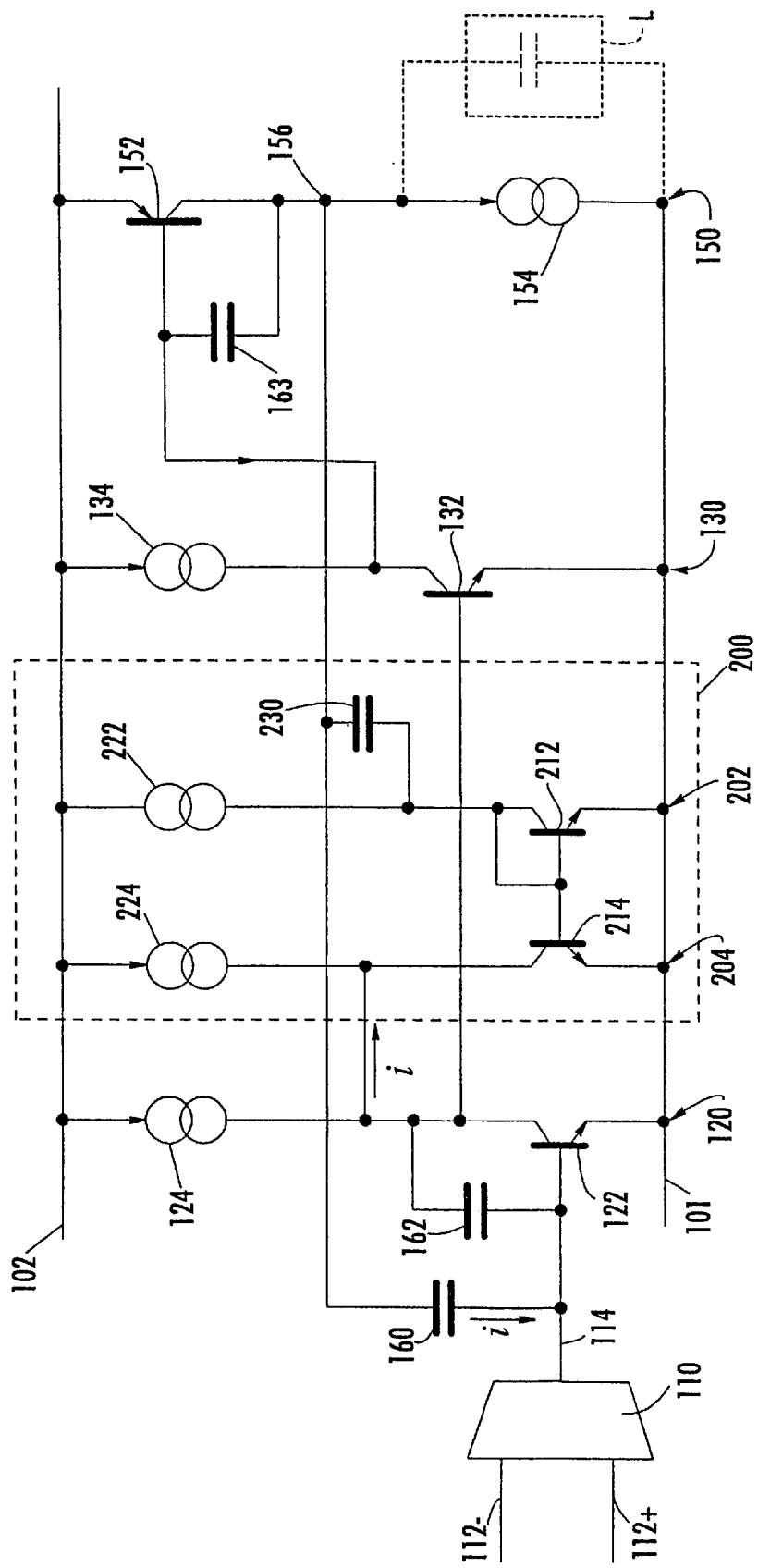
FIG. 2 is a circuit diagram of an operational amplifier according to the present invention.

The amplifier in FIG. 2 comprises an input stage 110 with two input terminals 112+ and 112−, and a current output 114. The current output 114 is connected to the base of an NPN bipolar transistor 122 that forms the input of a first intermediate stage 120.

The transistor 122 has a common emitter connected to a first power supply terminal 101, and a collector connected to a second power supply terminal 102 through a biasing circuit 124 in the form of a current source. The collector of transistor 122 forms the output from the first intermediate stage and is connected to the base of a transistor 132 that forms the input of a second intermediate stage 130.

There is a first Miller capacitor 162 with a value equal to $CM_2$ between the input and output of the first stage. In other words between the base and the collector of the transistor 122. A second Miller capacitor 160 with value CM is connected between the input of the first intermediate stage and the output terminal 156 of the output stage 150.

In general, a Miller capacitor equivalent to the second Miller capacitor 160 can be connected to the output of any intermediate stage after the intermediate stage at the input to which it is connected. Preferably, in order to avoid a signal inversion to create the counter-reaction, the second Miller capacitor may be connected to the output of a later stage in which the phase of the signals is opposite to the phase of the signals from the stage at the input to which it is connected.

In the example in FIG. 2, the output stage transistor is a PNP type transistor and the first intermediate stage transistor is of the NPN type. The phases of the signals in these stages are opposite. The second intermediate stage 130 and the output stage 150 are identical to those already described with reference to FIG. 2. Therefore, they are not described in detail. The output terminal 156 of the output stage is connected to an external load L.

Reference 200 denotes a current mirror that is associated with the first intermediate stage of the amplifier. The current mirror comprises a driver branch 202 formed around a first transistor 212 and a slave branch 204 formed around a second transistor 214. The first transistor 212 of the NPN type is used as a diode. Its emitter is connected to the first power supply terminal 101 and its base is connected to its collector. The base is also connected to the base of the second transistor 214 in the current mirror. The collector of the first transistor 212 is biased from a second power supply terminal 102 by a current source 222. It is also connected to the output terminal of the output stage through a "copy" capacitor 230.

The second transistor 214 in the current mirror is of the NPN type. Its emitter is connected to the first power supply terminal 101, and its collector is connected to the collector of transistor 122 in the first intermediate stage 120, i.e., to the output of this stage. The collector in the second transistor 216 is also biased by a current source 224 from the second power supply terminal 102.

In the example described, the first and second transistors 212 and 214 are of the same type and their emitter surfaces are approximately identical. Therefore, the copied current ratio from the driver branch to the slave branch is equal to 1. Furthermore, the value of the copy capacitor 230 is approximately the same as the value of the second Miller capacitor. Therefore, the current mirror takes off or removes a current from the collector of transistor 122 in the first stage 120. This value is approximately equal to the counter reaction current denoted i, injected into the base of the same transistor by the second Miller capacitor.

At low frequency, the first Miller capacitor 162 has a high impedance compared with the impedance of the transistor 122. The amplitude of a signal passing through the first stage 120 is greater on the collector of transistor 122 than on its base. At high frequency, the first Miller capacitor 162 has a low impedance compared with the impedance of the transistor, and the amplitude of a signal passing through the first stage 120 is greater on the base of transistor 122 than on its collector.

In the absence of the current mirror, the result is a change in the sign of the current of the signal passing through the first Miller capacitor 162. This sign change will be the cause of a zero as defined with reference to FIG. 1. However, the current taken off by the current mirror 200 cancels the current output by the second Miller capacitor 160, and which passes through the first Miller capacitor 162 at high frequency.

In this case, there is no longer any change in the sign of the current passing through the first Miller capacitor and the zero disappears. The constraint of the second stability equation described above is also eliminated. Therefore, the amplifier in FIG. 2 conforms with the invention, and is likely to output currents with a higher intensity and at a higher frequency.

Although only one of the stages in the example illustrated is equipped with a current mirror, several intermediate stages could be equipped with these mirrors to cancel several zeros, if necessary. Furthermore, the gain stages, i.e., the intermediate stages and the output stage, may be formed with several transistors instead of only one. For example, two symmetric transistors of opposite types PNP-NPN may be used for each stage in a class AB operating mode.

That which is claimed is:

1. An operational amplifier comprising:
    an input stage comprising differential inputs and an output;
    an output stage;
    at least one intermediate stage connected between said input stage and said output stage and defining a sequence of stages therewith;
    said output stage and each intermediate stage comprising at least one transistor comprising a pair of conduction terminals connected between first and second power supply terminals with one of the conduction terminals defining an output of a respective stage, and a control terminal defining an input of the respective stage;
    a first capacitor connected between the input and the output of said at least one intermediate stage;
    a second capacitor connected between the input of said at least one intermediate stage and an output of a next stage in the sequence of stages;
    a current mirror comprising a driver branch and a slave branch, the slave branch connected to the output of said at least one intermediate stage; and
    a third capacitor connected between the driver branch and the output of said output stage.

2. An operational amplifier according to claim 1, wherein said at least one transistor comprises a bipolar transistor.

3. An operational amplifier according to claim 1, wherein the input for each intermediate stage is connected to the output of a previous stage in the sequence of stages, and the output of each intermediate stage is connected to an input of a next stage in the sequence of stages.

4. An operational amplifier according to claim 1, wherein said first and second capacitors each defines a Miller capacitor.

5. An operational amplifier according to claim 1, wherein a ratio of a current being copied from the driver branch to the slave branch of said current mirror and a value of said third capacitor are chosen such that a current at the output of said at least one intermediate stage is approximately equal to a current conducting through said second capacitor.

6. An operational amplifier according to claim 1, wherein a ratio of a value of said second capacitor and said third capacitor is approximately equal to a ratio of a current being copied from the driver branch to the slave branch of said current mirror.

7. An operational amplifier according to claim 1, wherein a ratio of a current being copied from the driver branch to the slave branch of said current mirror is approximately equal to 1, and a value of said third capacitor is approximately equal to a value of said first capacitor.

8. An operational amplifier comprising:
    an input stage;
    an output stage;
    at least one intermediate stage connected between said input stage and said output stage and defining a sequence of stages therewith;
    said output stage and each intermediate stage connected between first and second power supply terminals, and each respective stage comprising an input and an output;

a first capacitor connected between the input and the output of said at least one intermediate stage;

a second capacitor connected between the input of said at least one intermediate stage and an output of a next stage in the sequence of stages;

a current mirror comprising a first branch and a second branch, the second branch connected to the output of said at least one intermediate stage;

a third capacitor connected between the first branch and the output of said output stage; and a ratio of a current being copied from the first branch to the second branch of said current mirror and a value of said third capacitor are chosen such that a current at the output of said at least one intermediate stage is approximately equal to a current conducting through said second capacitor.

9. An operational amplifier according to claim 8, wherein said output stage and each intermediate stage comprises at least one transistor comprising a pair of conduction terminals connected between the first and second power supply terminals, with one of the conduction terminals defining the output of a respective stage, and a control terminal defining the input of said respective stage.

10. An operational amplifier according to claim 9, wherein said at least one transistor comprises a bipolar transistor.

11. An operational amplifier according to claim 8, wherein said input stage comprises differential inputs.

12. An operational amplifier according to claim 8, wherein the input for each intermediate stage is connected to the output of a previous stage in the sequence of stages, and the output of each intermediate stage is connected to an input of a next stage in the sequence of stages.

13. An operational amplifier according to claim 8, wherein said first and second capacitors each defines a Miller capacitor.

14. An operational amplifier according to claim 8, wherein a ratio of a value of said second capacitor and said third capacitor is approximately equal to the ratio of the current being copied from the first branch to the second branch of said current mirror.

15. An operational amplifier according to claim 8, wherein the ratio of the current being copied from the first branch to the second branch of said current mirror is approximately equal to 1, and a value of said third capacitor is approximately equal to a value of said first capacitor.

16. A method for increasing the stability of an operational amplifier comprising an input stage, an output stage, and at least one intermediate stage connected between the input stage and the output stage and defining a sequence of stages therewith, the output stage and each intermediate stage connected between first and second power supply terminals, and each respective stage comprising an input and an output, a first capacitor connected between the input and the output of the at least one intermediate stage, and a second capacitor connected between the input of the at least one intermediate stage and an output of a next stage in the sequence of stages, the method comprising:

removing a current proportional to a current that is output by the second capacitor using a current mirror comprising a first branch and a second branch, the second branch is connected to the output of the at least one intermediate stage, and the first branch is connected to the output of the output stage via a third capacitor connected therebetween.

17. A method according to claim 16, wherein the at least one transistor comprises a bipolar transistor.

18. A method according to claim 16, wherein the input for each intermediate stage is connected to the output terminal of a previous stage in the sequence of stages, and the output of each intermediate stage is connected to an input of a next stage in the sequence of stages.

19. A method according to claim 16, wherein the first and second capacitors each defines a Miller capacitor.

20. A method according to claim 16, wherein a ratio of a current being copied from the driver branch to the slave branch of the current mirror and a value of the third capacitor are chosen such that a current at the output of the at least one intermediate stage is approximately equal to a current conducting through the second capacitor.

21. A method according to claim 16, wherein a ratio of a value of the second capacitor and the third capacitor is approximately equal to a ratio of a current being copied from the driver branch to the slave branch of the current mirror.

22. An operational amplifier according to claim 16, wherein a ratio of a current being copied from the driver branch to the slave branch of the current mirror is approximately equal to 1, and a value of the third capacitor is approximately equal to a value of the first capacitor.

* * * * *